(12) United States Patent
Kabir et al.

(10) Patent No.: US 9,264,062 B1
(45) Date of Patent: Feb. 16, 2016

(54) DIGITAL-TO-ANALOG CONVERTER CIRCUIT

(71) Applicants: Mohammad Nizam Kabir, Tempe, AZ (US); Brandt Braswell, Chandler, AZ (US); Mariam Hoseini, Tempe, AZ (US)

(72) Inventors: Mohammad Nizam Kabir, Tempe, AZ (US); Brandt Braswell, Chandler, AZ (US); Mariam Hoseini, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/644,941

(22) Filed: Mar. 11, 2015

(51) Int. Cl.
| | | |
|---|---|---|
| *H03M 1/66* | (2006.01) | |
| *H03M 1/68* | (2006.01) | |
| *H03M 1/06* | (2006.01) | |
| *G01S 7/35* | (2006.01) | |

(52) U.S. Cl.
CPC .................. *H03M 1/687* (2013.01); *G01S 7/35* (2013.01); *H03M 1/0604* (2013.01)

(58) Field of Classification Search
CPC ..... H03M 1/747; H03M 1/687; H03M 1/745; H03M 1/1061; H03M 1/1004; H03M 1/742
USPC .......................... 341/118, 120, 144, 145, 153
See application file for complete search history.

(56) References Cited

U.S. PATENT DOCUMENTS

| | | | | | |
|---|---|---|---|---|---|
| 5,870,044 | A * | 2/1999 | Dell'ova | ............. | H03M 1/1004 341/120 |
| 6,072,415 | A * | 6/2000 | Cheng | .................. | H03M 1/007 341/144 |
| 6,650,265 | B1 * | 11/2003 | Bugeja | ................. | H03M 1/002 341/131 |
| 6,674,377 | B1 * | 1/2004 | Li | ......................... | G11C 7/1057 341/118 |
| 7,173,553 | B2 * | 2/2007 | Ohmi | .................... | H03M 1/687 341/144 |
| 7,466,252 | B1 * | 12/2008 | Radulov | .............. | H03M 1/1061 341/120 |
| 8,094,055 | B2 * | 1/2012 | Gaknoki | ................. | H03M 1/68 341/118 |
| 8,284,099 | B2 | 10/2012 | Sakurai | | |
| 2002/0008651 | A1 * | 1/2002 | Bugeja | .................. | H03M 1/066 341/144 |
| 2002/0167430 | A1 * | 11/2002 | Boxho | .................. | H03M 1/066 341/118 |

(Continued)

OTHER PUBLICATIONS

Lin et al., "A 10-b, 500-MSample/s CMOS DAC in 0.6 mm2", IEEE Journal of Solid-State Circuits, vol. 33, No. 12, Dec. 1998, pp. 1948-1958.

Mitomo et al., "A 77 GHz 90 nm CMOS Transceiver for FMCW Radar Applications", IEEE Journal of Solid-State Circuits, vol. 45, No. 4, Apr. 2010, pp. 928-937.

(Continued)

*Primary Examiner* — Linh Nguyen
(74) *Attorney, Agent, or Firm* — Warren Rhoades LLP

(57) ABSTRACT

A digital to analog converter including a current source for providing a master current, a first sub digital to analog converter coupled to the current source which generates a plurality of currents, and a second sub digital to analog converter coupled to at least one of the plurality of currents from the first sub digital to analog converter which generates a second plurality of currents. The digital to analog converter also includes an overlap adjustment circuit coupled with the second sub digital to analog converter which adds current. The digital to analog converter is configured to operate in a first mode for generating a sine wave with a first bit level accuracy and, when in the first mode, the overlap adjustment circuit adds no current. to the second sub digital to analog converter The digital to analog converter is configured to operate in a second mode for generating a ramp wave with a second bit level accuracy and, when in the second mode, the overlap adjustment circuit adds current to the second sub digital to analog converter. When in the second mode, the total current of the second sub digital to analog converter and the overlap converter is greater than one of the plurality of currents generated by the first sub digital to analog converter.

15 Claims, 4 Drawing Sheets

(56) References Cited

U.S. PATENT DOCUMENTS

| | | | | |
|---|---|---|---|---|
| 2003/0001765 | A1* | 1/2003 | Bright | H03M 1/0604 341/145 |
| 2004/0233089 | A1* | 11/2004 | Confalonieri | H03M 1/68 341/145 |
| 2010/0164766 | A1* | 7/2010 | Lai | H03M 1/1057 341/120 |
| 2010/0289680 | A1* | 11/2010 | Ho | H03M 1/1057 341/120 |

OTHER PUBLICATIONS

Sakurai et al., "A 1.5GHz-Modulation-Range 10ms-Modulation-Period 180kHzms Frequency-Error 26MHz-Reference Mixed-Mode FMCW Synthesizer for mm-Wave Radar Application", ISSCC 2011, Session 16, mm-Wave Design Techniques, 16.8, pp. 292-294.

Wu et al., "A 56.4-to-63.4 GHz Multi-Rate All-Digital Fractional-N PLL for FMCW Radar Applications in 65 nm CMOS", IEEE Journal of Solid-State Circuits, vol. 49, No. 5, May 2014, pp. 1081-1096.

\* cited by examiner

DIGITAL-TO-ANALOG CONVERTER CIRCUIT

CROSS-REFERENCES TO RELATED APPLICATIONS

None

FIELD OF THE INVENTION

The invention relates to a digital-to-analog converter circuits, and more particularly, to digital-to-analog converter circuits with programmable resolution for frequency-modulated continuous-wave radar systems.

BACKGROUND

A digital-to-analog converter (DAC) is an electronic circuit that converts an input digital signal to an output analog signal. A numerical value represented by the digital signal input to the DAC corresponds with a magnitude of the analog signal output by the DAC. Various factors determine the performance of a DAC, including speed, resolution, and noise. Resolution refers to the smallest incremental signal that is generated by the DAC and corresponds with the Least Significant Bit (LSB) of the input digital signal. Noise refers to deviations of the output analog signal relative to an expected or desired level, particularly during switching from one digital value to another.

High performance DACs are useful for converting data with high resolution at high frequency and low noise. High performance DACs are used to generate a variety of signal outputs, including ascending and descending ramps and sinewaves. Typically, separate DACs are implemented to generate the various signal outputs. Various methods have been used in an attempt to improve behavior and performance, but many such conventional techniques introduce increased costs or increased size allocation.

Many prior art current-steering DACs are implemented using a segmented architecture. This architecture of the DAC is divided into two sub-DACs: the LSBs are implemented using a binary architecture while the most significant bits (MSBs) are implemented in a unary way. The major differential nonlinearity (DNL) errors occur during the transition of all LSBs to each MSB. DNL is the deviation between two analog values corresponding to adjacent input digital values. In many systems, the MSB current source needs to be matched to the sum of all the current sources of LSBs to within a small error range, for example 0.5 LSB. Because of statistical spread, such matching is difficult to achieve.

A frequency-modulated continuous-wave ("FMCW") radar system often uses a highly linear frequency ramp to provide accurate range and velocity information. The resolution of the ranging information is directly dependent on the linearity of the transmit signal as the transmit signal is also used to detect the signal received from the target. The output of the voltage-controlled oscillator ("VCO") that is used to generate the radar signal is typically non-linear. Therefore, digital-to-analog controller architecture for controlling the chirp linearity of the radar system is desired.

BRIEF DESCRIPTION OF THE DRAWINGS

A more complete appreciation of the invention is provided by reference to the following detailed description of the appended drawings and figures. The following descriptions, in conjunction with the appended figures, enable a person having skill in the art to recognize the numerous advantages and features of the invention by understanding the various embodiments. These drawings are provided to facilitate the reader's understanding of the invention and shall not be considered limiting of the breadth, scope, or applicability of the invention. It should be noted that for clarity and ease of illustration these drawings are not necessarily made to scale. The following figures are utilized to best illustrate these features.

Some of the figures included herein illustrate various embodiments of the invention from different viewing angles. Although the accompanying descriptive text may refer to such views as "top," "bottom" or "side" views, such references are merely descriptive and do not imply or require that the invention be implemented or used in a particular spatial orientation unless explicitly stated otherwise.

Figure 1:
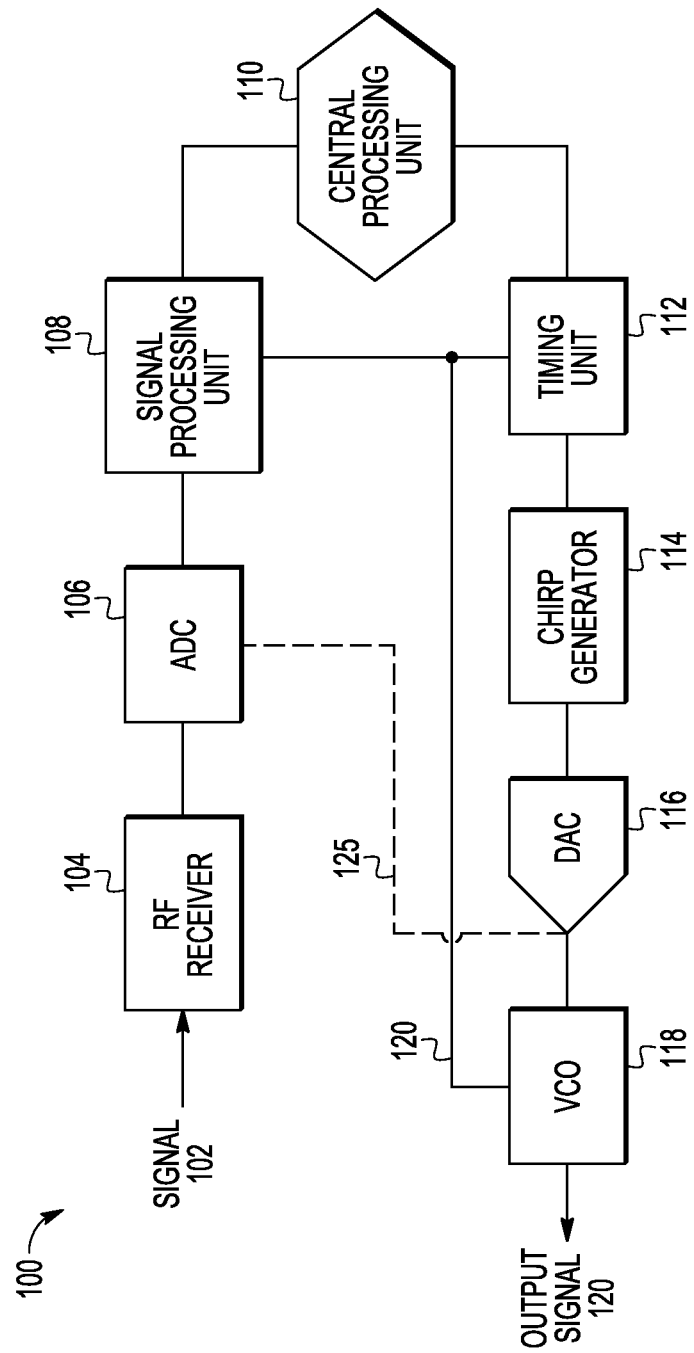
FIG. 1 is a diagram of a frequency-modulated continuous-wave system according to one embodiment of the invention.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE INVENTION

A multipurpose digital to analog converter, according to one embodiment, is configured to operate in multiple modes to produce a variety of wave forms including a sine wave and both rising and falling ramp waves. In prior art systems, multiple digital to analog converters were implemented to generate these various wave forms. The multipurpose digital to analog converter includes an overlap current circuitry to provide additional current to assist in the transition from all LSBs to an MSB. In a first mode, the overlap current circuitry is not employed. The multipurpose digital to analog converter generates a sine wave while maintaining a ten (10) bit level accuracy during the LSB to MSB transition. In a second mode, the multipurpose digital to analog converter generates a ramp wave while maintaining a twelve (12) bit level accuracy. In one embodiment, the accuracy for the multipurpose digital to analog converter transition from all LSBs to a MSB is one half (0.5) LSBs. It is understood that a wide variety of accuracy levels may be implemented without detracting from the spirit of the invention. In the second mode, the overlap current circuitry is implemented to provide additional current to the LSBs reducing or eliminating the major DNL errors. In the second mode, the ramp wave is used to control a voltage controlled oscillator (VCO) of a frequency-modulated continuous-wave ("FMCW") radar system.

According to one embodiment, the multipurpose digital to analog converter uses current steering architecture to generate analog steps from a digital input sequence. The multipurpose digital to analog converter is divided into two sub-digital to analog converters, one for the MSBs and one for the LSBs. The sub-digital to analog converters may be implemented as unary-weighted, binary-weighted, or a mixture of both. The sub-digital to analog converters may include a wide variety of MSB or LSB allocations without detracting from the spirit of the invention. In one embodiment, the MSBs are implemented as a five (5) unary-weighted sub-digital to analog converter and the LSBs are implemented as a seven (7) unary-weighted and binary-weighted sub digital to analog converter. In this embodiment, the LSB includes a four (4) unary-weighted and three (3) binary-weighted sub-digital to analog converter. To meet accuracy and fall time matching requirements of the frequency-modulated continuous-wave ("FMCW") radar system, the LSB architecture is implemented in both a unary and binary way. In one embodiment, the LSB architecture has 15 unary-weighted current sources and 3 binary-weighted current sources (target weight for the unary-weighted current source is 8 uA and the binary-weighted current sources are 4 uA, 2 uA, and 1 uA). In one embodiment, the MSB architecture has 31 equally weighted current sources (target weight for one embodiment is 128 uA for each current source). During the transition of all LSB current sources to one of the MSB current sources (for example if the multipurpose digital to analog converter digital input switches from 000001111111 to 000010000000), the MSB current source is one step greater than the sum of all LSB current sources so that the multipurpose digital to analog current source output increases only by 1 uA.

The FMCW radar system, according to one embodiment, accepts a high level of negative DNL ((actual step-ideal step)/ideal step) and cannot handle a missing step, thus the difference in output step can go negative during the LSB to MSB transition. Therefore, according to one embodiment, a negative DNL is created by adjusting the ratio of the total current of all LSBs to each MSB current. Negative DNL is achieved in two ways: (1) keeping the LSB current constant, then each MSB current can be adjusted to be smaller than the sum of all LSB current (for example, IMSB=120 uA and ILSB=127 uA); and (2) keeping the MSB current constant, then the sum of all LSB current can be adjusted to be higher than each MSB current (for example, IMSB=128 uA and ILSB=134 uA).

The multipurpose digital to analog converter, according to one embodiment, when implemented as ramp wave generator provides additional overlap current in the LSBs to adjust the overall LSB current to a level above the MSB current so there is no missing step at the output of the digital to analog converter transition from all LSBs to a MSB.

Referring now to FIG. 1, an exemplary frequency-modulated continuous-wave system 100 in accordance with one embodiment of the invention is disclosed. The frequency-modulated continuous-wave system is implementable, in one embodiment, in a frequency-modulated continuous-wave radar system. An input signal 102 is received in an RF receiver 104. The signal 102 is transmitted to an analog to digital converter 106 for conversion from analog to digital. In one embodiment, the analog to digital converter 106 is one or more continuous time sigma delta analog to digital converters. A digital representation of the signal is transmitted from the analog to digital converter 106 to the signal processing unit 108 and a central processing unit 110. The central processing unit 110 may be a single unit or a plurality of interconnected central processing units.

Once the digital signal has been processed, the digital signal is transmitted to a timing unit 112. The timing unit 112 provides a highly accurate clock signal for use in the generation of an output signal. The timing unit 112 provides an output to a chirp generator 114 which provides an input to the multipurpose digital to analog converter 116. The multipurpose digital to analog converter 116 is discussed herein in more detail in reference to FIGS. 2 and 3. In one mode, the output from the multipurpose digital to analog converter 116 is transmitted in the form of a ramp wave to the voltage controlled oscillator (VCO) 118. The VCO 118 provides an output signal 120. In one embodiment, a second mode of the multipurpose digital to analog converter 116 provides an output signal 125 to the analog to digital converter 106 in the form of a sine wave and is used by the analog to digital converter 106 to perform functional safety and performance checks. In this embodiment, the output signal 125 is provided in a loop back mode and the two modes of the multipurpose digital to analog converter 116 of the frequency-modulated continuous-wave system 100 provide a sine wave test analog signal 125 to the analog to digital converter 106 in addition to the ramp wave transmitted to the VCO 118 for use in the generation of a radar signal. This dual purpose usage of the digital to analog converter 116 reduces the overall size requirements of the frequency-modulated continuous-wave system 100.

Figure 2:
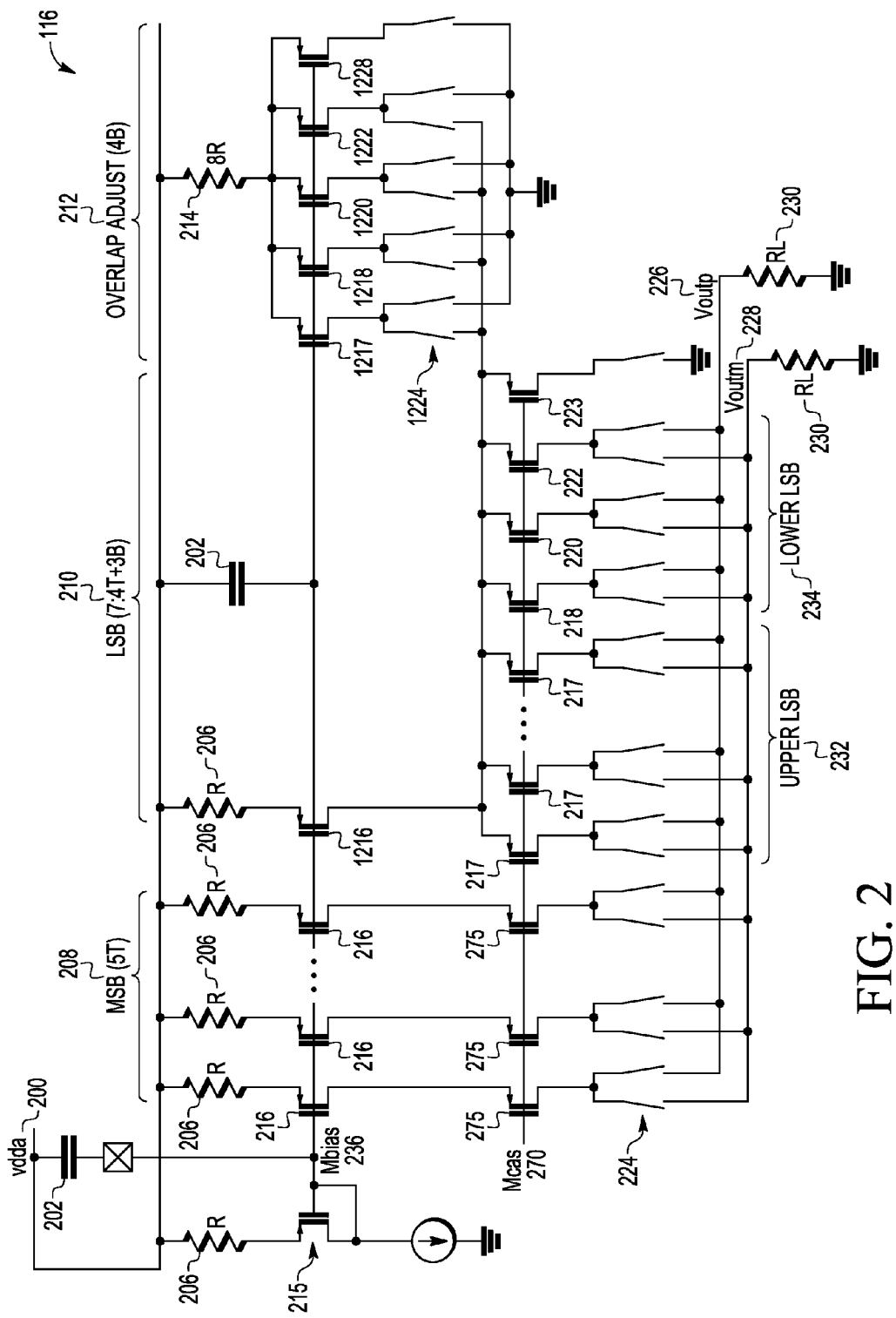
FIG. 2 is a diagram of a multipurpose digital to analog converter circuit according to one embodiment of the invention.

Referring now to FIG. 2, a diagram of the multipurpose digital to analog converter 116 circuit according to one embodiment of the invention is provided. Power source vdda 200 is shown connected to a capacitor 202. In one embodiment, a 10 uF capacitor 202 is implemented in the multipurpose digital to analog converter 116. A first transistor 215 is connected to a resistor 206 which is connected to the power source vdda 200 and generates the Mbias 236 signal. In one embodiment, the first transistor 215 generates 128 times the base current (IO), or 128 uA of current when the base current (IO) is set to 1 uA in one embodiment. MSB transistors 216 and an LSB master transistor 1216 are connected to resistors R 206 which are connected to the power source vdda 200 and are connected to the first transistor 215 through the Mbias 236. The MSB transistors 216 and the LSB master transistor 1216 are mirrored devices of the first transistor 215 and generate fixed current. The Mbias 236 controls the MSB transistors 216 and the LSB master transistor 1216 and maintains a fixed, equal current among the MSB transistors 216 and the LSB master transistor 1216. A wide variety of current generation sources for the Mbias 236, including an amplifier or fixed current source, may be implemented without detracting from the spirit of the invention. The multipurpose digital to analog converter 116 may be formed from a single digital to analog converter or may be formed from multiple sub-digital to analog converters.

In one embodiment, the digital to analog converter 116 is partitioned in to two sub digital to analog converters. The first sub digital to analog converter is directed toward the MSBs 208. According to one embodiment, the MSBs 208 are implemented in a unary way and provide 31 current sources. A base current (IO) is set to 1 uA. Each current source provides 128 times the base current (IO) or 128 uA. The second sub digital to analog converter is directed toward the LSBs 210. According to one embodiment, the LSBs 210 are implemented in both a unary way providing 15 current sources through first LSB transistors 217 (upper LSB 232) and a binary way providing 3 current sources through a second LSB transistor 218, a third LSB transistor 220 and a fourth LSB transistor 222 (lower LSB 234). Each unary current source through the first LSB transistor 217 provides 8 times the base current (IO) for a 8 uA current and the binary current source provides one each of a 4 times, 2 times, and 1 times the base current (IO) for 4 uA, 2 uA, and 1 uA currents. A LSB ground transistor 222 providing a 1 uA current is tied directly to ground and does not provide current to the output signal. All of the current for the LSBs 210 is provided through the LSB master transistor 1216, thus the total current for all LSBs 210 and the 1 uA ground is equal to the 128 uA current generated from a single MSB 208. The total current of the LSBs 210 is 127 uA. A single MSB 208 is 128 uA. Cascode transistors 275 are connected to the MSB transistors 216 and the switches 224 and are stacked transistors to provide increased output impedance. The cascode transistors 275 are controlled by Mcas 270, a bias signal.

Additionally, the overlap adjustment circuitry 212 is provided connected to the LSBs 210. The overlap adjustment circuitry 212 is connected to the power source vdda 200 through resistor 8R 214 and is also connected to the power source vdda 200 through capacitor 202 and to the LSB master transistor 1216 through the Mbias 236. In one embodiment, resistor 8R 214 has a resistance eight times greater than resistor R 206 and the overlap adjustment circuitry 212 provides one-eighth of the current to the LSBs 210. For example, if the current to the MSBs 208 with resistor R 206 provides 128 times the base current (IO), then the overlap adjustment circuitry 212 current with resistor 8R 214 provides 16 times the base current (IO). Overlap adjustment circuitry 212, or calibration circuitry, is a digital to analog converter providing an additional 1 uA to 15 uA of current to the LSBs 210. The current through a first overlap transistor 1217 provides 8 uA, the current through a second overlap transistor 1218 provides 4 uA, the current through a third overlap transistor 1220 provides 2 uA, and the current through a fourth overlap transistor 1222 provides 1 uA. An overlap ground transistor 1228, providing a 1 uA current, is tied directly to ground in the overlap adjustment circuitry 212. The additional current from the overlap adjustment circuitry 212 is spread proportionally across the first, second, third, and fourth LSB transistors 217, 218, 220, and 222 and the LSB ground transistor 223. For example, the additional current is proportionally spread among all of the LSB 210 current sources, including all fifteen (15) current sources through first LSB transistors 217 (upper LSB 232) and three (3) current sources through second, third, and fourth LSB transistors 218, 220 and 222 (lower LSB 234) and the LSB ground transistor 223.

Switches 224 are connected to the MSB transistors 216 and the first, second, third, and fourth LSB transistors 217, 218, 220 and 222 and are set in either an "ON" state or an "OFF" state. The switches 224 steer the current to the load while the current is generated by the MSBs 208 and LSBs 210 of the digital to analog converter 116. One output of the switches 224 is identified as Voutp 226 which is connected to resistor RL 230. A second output of the switch 224 is identified as Voutm 228 and is connected to resistor RL 230. When the switches 224, which are connected to the MSB transistors 216 and the first, second, third, and fourth LSB transistors 217, 218, 220 and 222, are set to the "OFF" state, the switches connect the MSB transistors 216 and the first, second, third, and fourth LSB transistors 217, 218, 220 and 222 to the Voutm 228. When the switches 224 are set to the "ON" state, the MSB transistors 216 and the first, second, third, and fourth LSB transistors 217, 218, 220, and 222 are connected to the Voutp 226. The switch 224 connected to the LSB ground transistor 223 is continuously connected to the ground. Voutp 226 and Voutm 228 provide a differential voltage output. Each of the switches 224 is independently controllable and are either set to (0, 1) or (1, 0) wherein the first value is associated with the switch on the left of the switches 224 and the second value is associated with the switch on the right of the switches 224. In one embodiment, the switches 224 and 1224 includes a pmos switch which is a logic 0 "ON" state and a logic 1 "OFF" state. For example, if all of the switches 224 are set to (0, 1), then all of the current generated by the MSB transistors 216 and the first, second, third, and fourth LSB transistors 217, 218, 220 and 222 flows into Voutp 226. No current is then flowing into Voutm 228. If all of the switches 224 are set to (1, 0), then all of the current generated by the MSB transistors 216 and the first, second, third, and fourth LSB transistors 217, 218, 220 and 222 flows into Voutm 228. No current is then flowing into Voutp 226.

Overlap switches 1224 are connected to the first, second, third and fourth overlap transistors 1217, 1218, 1220, and 1222 and are set in either an "ON" state or an "OFF" state. The overlap switches 1224 control the amount of current produced by the overlap adjustment circuit 212 of the digital to analog converter 116. One output of the overlap switches 1224 is tied to ground. A second output of the overlap switches 1224 is connected to the drain of the LSB master transistor 1216. When the overlap switches 1224, which are connected to the first, second, third, and fourth overlap transistors 1217, 1218, 1220 and 1222, are set to the "OFF" state, the overlap switches connect the first, second, third, and fourth overlap transistors 1217, 1218, 1220 and 1222 to ground. When overlap switches 1224 are set to the "ON" state, the first, second, third, and fourth overlap transistors 1217, 1218, 1220 and 1222 are connected to the drain of the LSB master transistor 1216. The overlap switch 1224 connected to an overlap ground transistor 1228 is continuously connected to ground. Each of the overlap switches 1224 is independently programmable and will remain in the programmed state. The overlap switches 1224 are programmed after the currents from the MSBs 208 and LSBs 210 are measured after production. Once the currents are measured, the amount of additional current necessary from the overlap adjustment circuit 212 is calculated and the overlap switches 1224 are programmed to produce that level of current. For example, if an additional 7 uA of current is required from the overlap adjustment circuit 212, then the switch 1224 for first overlap transistor 1217 is set to the "OFF" state and the switches 1224 for the second, third, fourth overlap transistors 1218, 1220, and 1222 are set to the "ON" state. In one embodiment, the overlap adjustment switches 1224 are connected to the drain of the LSB master transistor 1216 and therefore the additional overlap current is being added from the drain side of LSB master transistor 1216.

Figure 3:
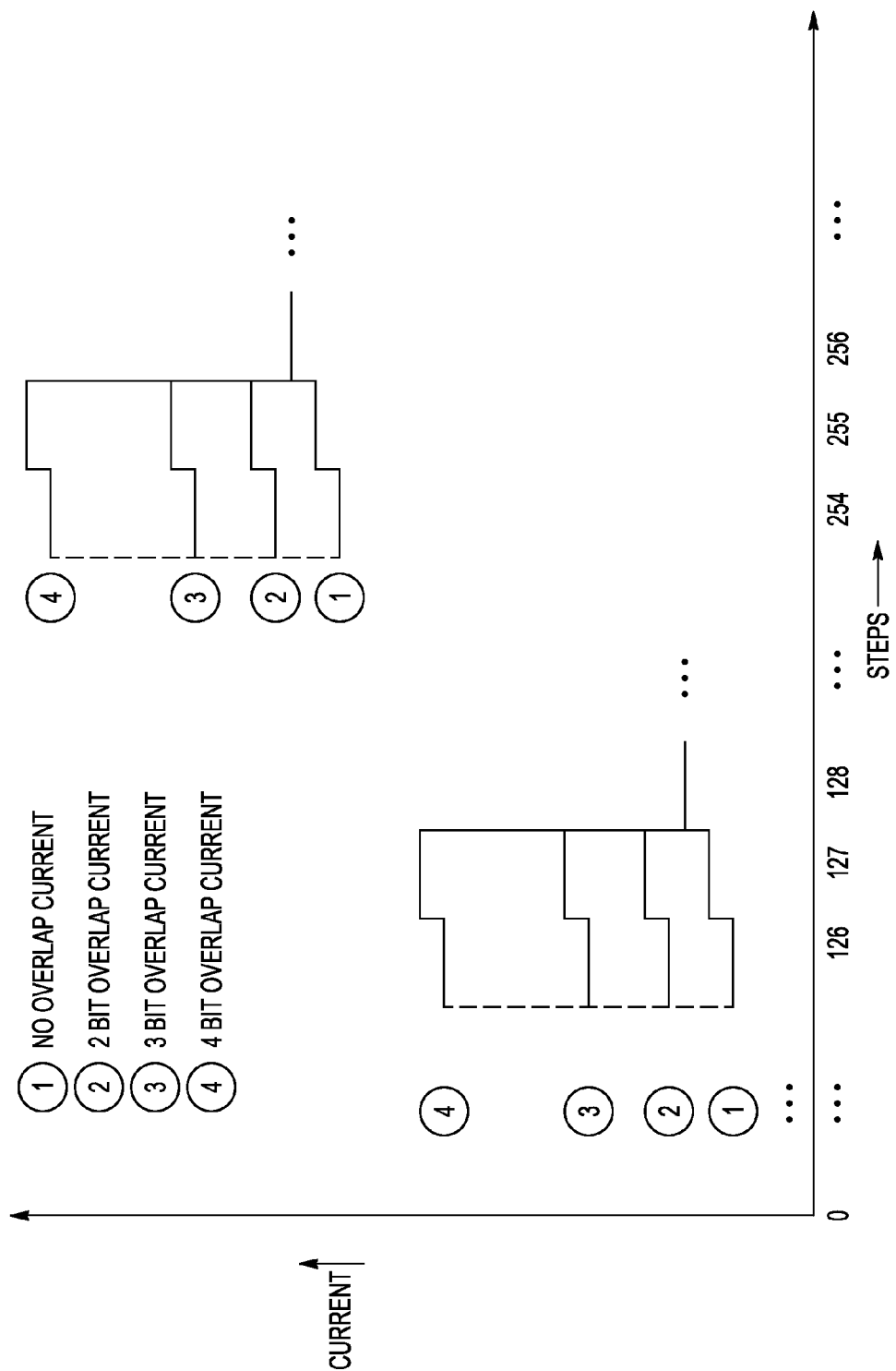
FIG. 3 is a chart of the output voltage according to one embodiment of the invention.

Referring now to FIGS. 2 and 3, the functionality and output of the multipurpose digital to analog converter 116 is disclosed according to one embodiment. In one embodiment, the multipurpose digital to analog converter 116 is configured to operate in at least two modes: a sine wave mode and a ramp wave mode. During the generation of the sine wave, the overlap adjustment circuitry 212 is not employed and no additional current is added to the LSBs 210. The multipurpose digital to analog converter 116 generates a sine wave while maintaining a ten (10) bit level accuracy during the LSBs 210 to MSB 208 transitions. The lower level accuracy does not require the overlap adjustment circuitry 212 additional current for the LSBs 210 during the LSBs 210 to MSB 210 transitions. A wide variety of accuracy levels may be implemented, including but not limited to 6 bit, 8 bit, and 14 bit level accuracy, without detracting from the spirit of the invention. During the generation of the ramp wave, the multipurpose digital to analog converter 116 generates a ramp wave while maintaining a twelve (12) bit level accuracy. In this second mode, the overlap adjustment circuitry 212 is implemented to provide additional current to the LSBs so that the total LSB 210 current exceeds a single MSB 208 current.

Ideally in one embodiment, in the ramp wave mode, the transition from all LSBs 210 to one MSB 208 is a change in total current from 127 uA to 128 uA. However, due to loss and error, the total current for the LSBs 210 may be less than 127 uA, such as 124 uA. In this situation, the transition to one MSB 208 would cause a jump or skip in current steps 125 uA, 126 uA, and 127 uA. In a system such as the FMCW radar system, a jump or skip as described herein exceeds the tolerance for a step or ramp wave. These types of systems do allow for a higher negative differential nonlinearity thus allowing for the output step to go negative during the LSBs 210 to MSB 208 transitions.

Referring now to FIG. 3, the current output of the multipurpose digital to analog converter 116 in the ramp wave mode is shown for transitions between the steps before all LSBs, all LSBs, no LSBs and an MSB, such as steps 126, 127 to step 128. Line 1 shows the current of the multipurpose digital to analog converter 116 without any additional current. During the 126 steps, the multipurpose digital to analog converter 116 current is constant. After the transition to step 127, the step where all of the LSBs' 210 switches 224 are set to "ON", the current level is increased and remains constant. After the transition to step 128, a transition to an MSB 208, a current from a single MSB 200 is shown and the current from all of the LSBs 210 are zero (the LSBs' 210 switches 224 are all set to "OFF"). In one embodiment, the transition from 126 to 127 is 1 uA and the transition from 127 to 128 is 1 uA. Line 2 shows the current of the multipurpose digital to analog converter 116 with 3 uA (2 bit) of additional current from the overlap adjustment circuitry 212 to the LSBs 210. During the 126 step, a constant current is shown. After the transition to step 127, the step where all of the LSBs' 210 switches 224 are set to "ON", the current level is increased and remains constant. After the transition to step 128, a transition to an MSB 208, the total current of the multipurpose digital to analog converter 116 is dropped to a level of the current from a single MSB 208 with the current from all of the LSBs 210 at zero. In this example, the transition from all LSBs 210 to a MSB 210 is a negative current drop of approximately 2 uA (127 uA+3 uA=130 uA to 128 uA). This information is also shown in Table 1 provided below which provides the analog current output of the second sub-digital to analog converter output, in micro-amps, for the specific steps, or digital input codes.

TABLE 1

| | | Digital Input Code (Decimal Format) | | | | | | | |
|---|---|---|---|---|---|---|---|---|---|
| | | 0 | ••• | 126 | 127 | 128 | ••• | 254 | 255 | 256 |
| Analog | no_overlap | 0 | ••• | 126 | 127 | 128 | ••• | 254 | 255 | 256 |
| Current | 2 bit overlap | 0 | ••• | 128.9764 | 130 | 128 | ••• | 256.9764 | 258 | 256 |
| Output | 3 bit overlap | 0 | ••• | 132.9449 | 134 | 128 | ••• | 260.9449 | 262 | 256 |
| (uA) | 4 bit overlap | 0 | ••• | 140.8819 | 142 | 128 | ••• | 268.8819 | 270 | 256 |

For the 2-bit overlap shown in Table 1, also shown as Line 2 in FIG. 3, at step 127 the total LSB current is 130 uA. After the transition to step 128, the total LSB current drops to 128 uA.

Line 3 shows the current of the multipurpose digital to analog converter 116 with 7 uA (3 bits) of additional current to the LSBs 210. During the 126 step, the current is shown as constant. After the transition to step 127, the step where all of the LSBs' 210 switches 224 are set to "ON", the current level is increased and remains constant. After the transition to the step 128, a transition to an MSB 208, the total current of the multipurpose digital to analog converter 116 is dropped to a level of the current from a single MSB 200 with the current from all of the LSBs 210 at zero. In this example, the transition from all LSBs 210 to an MSB 210 is a negative current drop of approximately 6 uA (127 uA+7 uA=134 uA to 128 uA). This information is also shown in Table 1 for the 3-bit overlap. Finally, Line 4 shows the current of the multipurpose digital to analog converter 116 with 15 uA of additional current to the LSBs 210. During the 126 step, a constant current is shown. After the transition to step 127, the step where all of the LSBs' 210 switches 224 are set to "ON", the current level is increased and remains constant. After the transition to step 128, a transition to an MSB 208, the total current of the multipurpose digital to analog converter 116 is dropped to a level of the current from a single MSB 200 with the current from all of the LSBs 210 at zero. In this example, the transition from all LSBs 210 to an MSB 210 is a negative current drop of approximately 14 uA (127 uA+15 uA=142 uA to 128 uA). This information is also shown in Table 1 for the 4-bit overlap. As the additional current from the overlap adjustment circuitry 212 is increased, a greater negative current drop between the transition between all of the LSBs 210 and an MSB 208 is shown. The amount of additional current from the overlap adjustment circuitry 212 is programmable and may be varied from system to system.

Table 2 provided below provides the current for the LSBs as discussed herein.

TABLE 2

| LSB Calculation | | | |
|---|---|---|---|
| Overlap Adjustment code | Overlap Adjustment current (uA) | Total LSB current (uA) | Second Sub-Digital to Analog Converter (LSB) size (uA) |
| no_overlap 0000 | 0 | 127 | 1 |
| 2 bit overlap 0011 | 3 | 130 | 1.023622047 |
| 3 bit overlap 0111 | 7 | 134 | 1.05511811 |
| 4 bit overlap 1111 | 15 | 142 | 1.118110236 |

To determine the amount of current of a single LSB 210, the following equation is used (Total Current from LSBs+Overlap Adjustment Current/Total number of LSBs). In the example shown by Line 2, the two (2) bit overlap, the amount of overlap adjustment current in each LSB is: (127 uA+3 uA/127 LSBs)−(127 uA/127 LSBs)=0.02 uA. This value is also shown in Table 2. A small amount of current is added to each LSB where the total LSBs current is increased by 3 uA.

In one embodiment, the additional current for the LSBs 210 is provided for each iteration of the steps. The transition from all LSBs 210 to an MSB 208 has been disclosed and is applicable to each transition from all LSBs. For example, the additional current from the overlap adjustment circuitry 212 is present during the transition from 1 MSB 208 and all LSBs 210 to 2 MSBs 208 (steps 255 to 256), from 2 MSBs 208 and all LSBs 210 to 3 MSBs 208, continuing through 30 MSBs 208 and all LSBs 210 to 31 MSBs 208. It should be understood by one skilled in the art that the number of MSBs and LSBs may vary without detracting from the spirit of the invention. Further, it should be understood by one skilled in the art that the base current and current levels provided by the transistors may vary without detracting from the spirit of the invention.

Figure 4:
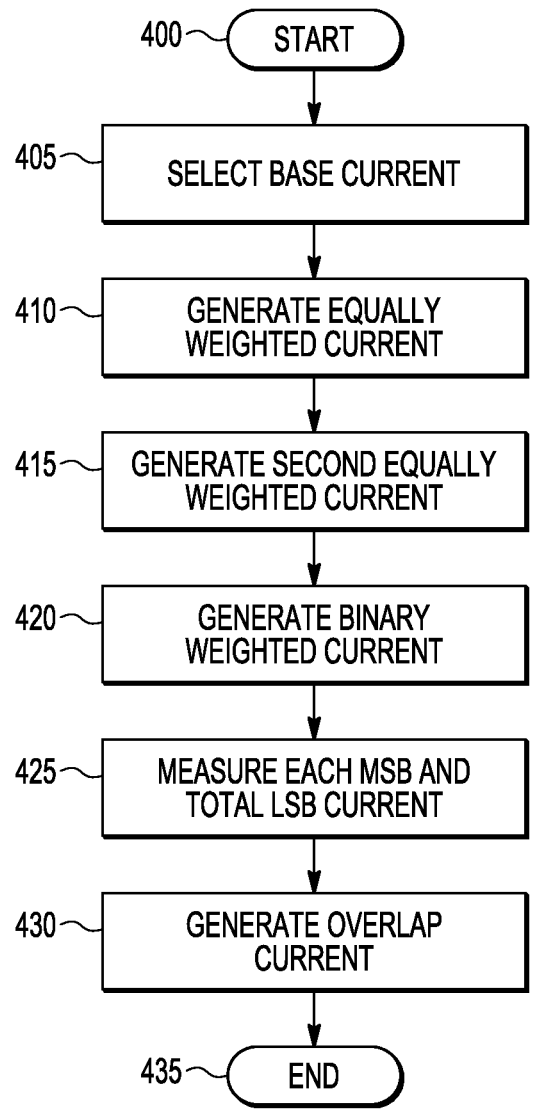
FIG. 4 is a flow chart depicting the method of overlapping current of the least significant bits of a digital to analog converter according to one embodiment of the invention.

Referring now to FIG. 4, a flow diagram depicting the method of adding current of the least significant bits of a digital to analog converter according to one embodiment of the invention is shown. The process begins with Start 400. A base current, IO, is selected in step 405. In one embodiment, a 1 uA current is selected. However, a wide variety of base current levels may be selected without detracting from the spirit of the invention. Additionally, the total current and voltage to be supplied by the multipurpose digital to analog converter 116 is determined. Further, the number of MSBs 208 and LSBs 210 are selected as well as the current levels for each. Again, a wide variety of MSB and LSB combinations, as well as total current levels, may be selected without detracting from the spirit of the invention. In step 410, an equally weighted current is generated through the MSB transistors 216. In one embodiment, the IO is set to 1 uA and the current generated through a MSB transistor 216 is 128 times the base current (IO). In step 415, the current for the upper LSBs 210 is generated. The current for the upper LSBs 232 is generated through each first LSB transistors 217 and is eight (8) times the base current (IO). In step 420, the current for the lower LSBs 234 is generated through the second, third, and fourth transistors 218, 220, and 222, and is four (4), two (2), and one (1) times the base current (IO) accordingly. An IO current is generated through the LSB ground transistor 223 and passed directly to ground. In one embodiment, the total LSB current, both for upper LSB 232 and lower LSB 234, is provided through the LSB master transistor 1216. In this embodiment, the maximum current for the LSBs 210, without any additional current from the overlap adjustment circuitry 212 is equal to or less than the current for a single MSB 208. The actual MSB current for each MSB and the total LSB current is determined in step 425. All LSBs 210 are placed "ON" and the total actual current provided by all of the LSBs is determined. The actual current is then compared to the ideal current and the current level for each MSB 208. An overlap current level is determined and generated in step 430. Once all of the MSB 208 currents and the total LSB 210 current has been measured, the largest MSB 208 current is determined. The total LSB 210 current plus the overlap current must exceed the largest MSB 208 current to ensure no missing steps. Based upon this information, the overlap current level is calculated. Once the additional current level is determined, the overlap adjustment circuitry is programmed to provide the additional current. No additional programming of the overlap adjustment circuit 212 is necessary after the initial programming. In another embodiment, the total actual current provided by the LSBs 210 and the overlap adjustment circuitry 212 is repeatedly measured and programmed until the additional current, combined with the actual LSB 210 current, exceeds the actual and ideal current for the MSB 208. The method ends with step 435.

In one embodiment, a digital to analog converter is shown including a current source for providing a master current, a first sub digital to analog converter coupled to the current source, wherein the first sub digital to analog converter generates a plurality of currents, a second sub digital to analog converter coupled to at least one of the plurality of currents from the first sub digital to analog converter, wherein the second sub digital to analog converter generates a second plurality of currents, and an overlap adjustment circuit coupled with the second sub digital to analog converter, wherein the overlap adjustment circuit adds current and wherein the digital to analog converter is configured to operate in a first mode for generating a sine wave wherein the sine wave has a first bit level accuracy and wherein the overlap adjustment circuit adds no current to the second sub digital to analog converter and wherein the digital to analog converter is configured to operate in a second mode for generating a ramp wave wherein the ramp wave has a second bit level accuracy and wherein the overlap adjustment circuit adds current to the second sub digital to analog converter, and wherein, during the second mode, the total current of the second sub digital to analog converter and the overlap converter is greater than one of the plurality of currents generated by the first sub digital to analog converter.

The currents of the first sub-digital to analog converter include the most significant bits and the currents of the second sub-digital to analog converter include the least significant bits. Further, the currents from the first sub-digital to analog converter include a plurality of currents each equal to the master current and the currents from the second sub-digital to analog converter include a second plurality of currents cumulatively equal to a single current generated by the first sub digital to analog converter.

Additionally, the most significant bits include five most significant bits and the least significant bits include seven least significant bits and the currents of the least significant bits are variably weighted, including binary weighted currents. During the first mode, the current of one most significant bit is greater than or equal to the current of all of the least significant bits and the sine wave first bit level accuracy is a ten bit level accuracy and the ramp wave second bit level accuracy is a twelve bit level accuracy.

In another embodiment, a frequency modulated continuous wave transceiver with a multiple mode digital to analog converter is shown including an analog to digital converter, a digital to analog converter coupled to a voltage controlled oscillator, the digital to analog converter further including a current source for providing a master current, a first sub digital to analog converter coupled to the current source, wherein the first sub digital to analog converter generates a plurality of currents, a second sub digital to analog converter coupled to at least one of the plurality of currents from the first sub digital to analog converter, wherein the second sub digital to analog converter generates a second plurality of currents and an overlap adjustment circuit coupled with the second sub digital to analog converter, wherein the overlap adjustment circuit adds current, wherein the digital to analog converter is configured to operate in a first mode for generating a sine wave to the analog to digital converter wherein the sine wave has a first bit level accuracy and wherein the overlap adjustment circuit adds no current and wherein the digital to analog converter is configured to operate in a second mode for generating a ramp wave to the voltage controlled oscillator, wherein the ramp wave has a second bit level accuracy and wherein the overlap adjustment circuit adds current to the second sub digital to analog converter, and wherein, during the second mode, the total current of the second sub digital to analog converter and the overlap converter is greater than one of the plurality of currents generated by the first sub digital to analog converter.

The digital to analog converter generates a falling ramp signal, including a 12 bit level accuracy falling ramp signal. The digital to analog converter also generates a sine wave for transmission to the analog to digital converter, including continuous time sigma delta analog to digital converters, the generated sine wave for use as an element of an internal check. The generated sine wave includes a ten bit level accuracy sine wave.

In another embodiment, a method of transitioning from all of the least significant bits to a most significant bit in a digital to analog converter is shown including the steps of: generating a current for each most significant bit, generating a second current to each of a first set of the least significant bits and generating a third current to a second set of the least significant bits, wherein the sum of the second and third currents equals the current for a most significant bit, and generating an overlap current to add to the total current of the least significant bits, wherein the total current of the least significant bits with the overlap current is greater than the current from a single most significant bit.

In the method, the current for each most significant bit is equal and each second current for the first set of least significant bits is equal and the third current of the second set of the least significant bits is binary weighted. Further, the method including measuring the current from the most significant bits and the least significant bits, wherein the overlap current is programmed in relation to the measured current from the most significant bits and the least significant bits.

Although the invention is described herein with reference to specific embodiments, various modifications and changes can be made without departing from the scope of the invention as set forth in the claims below. Accordingly, the specification and figures are to be regarded in an illustrative rather than a restrictive sense, and all such modifications are intended to be included within the scope of the invention. Any benefits, advantages, or solutions to problems that are described herein with regard to specific embodiments are not intended to be construed as a critical, required, or essential feature or element of any or all the claims.

From time-to-time, the invention is described herein in terms of these example embodiments. Description in terms of these embodiments is provided to allow the various features and embodiments of the invention to be portrayed in the context of an exemplary application. After reading this description, it will become apparent to one of ordinary skill in the art how the invention can be implemented in different and alternative environments. Unless defined otherwise, all technical and scientific terms used herein have the same meaning as is commonly understood by one of ordinary skill in the art to which this invention belongs.

The following discussion is presented to enable a person skilled in the art to make and use the invention. The general principles described herein may be applied to embodiments and applications other than those detailed below without departing from the spirit and scope of the invention as defined by the appended claims. The invention is not intended to be limited to the embodiments shown, but is to be accorded the widest scope consistent with the principles and features disclosed herein.

In addition, while a particular feature of the invention may have been disclosed with respect to only one of several embodiments, such feature may be combined with one or more other features of the other embodiments as may be desired. It is therefore, contemplated that the claims will cover any such modifications or embodiments that fall within the true scope of the invention.

The various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one", "one or more" or the like; and adjectives such as "conventional", "traditional", "normal", "standard", "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more", "at least", "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed across multiple locations.

Unless stated otherwise, terms such as "first" and "second" are used to arbitrarily distinguish between the elements such terms describe. Thus, these terms are not necessarily intended to indicate temporal or other prioritization of such elements.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A digital to analog converter, comprising:
   a current source for providing a master current;
   a first sub digital to analog converter coupled to the current source, wherein the first sub digital to analog converter generates a plurality of currents;
   a second sub digital to analog converter coupled to at least one of the plurality of currents from the first sub digital to analog converter, wherein the second sub digital to analog converter generates a second plurality of currents;
an overlap adjustment circuit coupled with the second sub digital to analog converter, wherein the overlap adjustment circuit adds current, wherein
the digital to analog converter is configured to operate in a first mode for generating a sine wave wherein the sine wave has a first bit level accuracy and wherein the overlap adjustment circuit adds no current to the second sub digital to analog converter,
the digital to analog converter is configured to operate in a second mode for generating a ramp wave wherein the ramp wave has a second bit level accuracy and wherein the overlap adjustment circuit adds current to the second sub digital to analog converter, and
during the second mode, the total current of the second sub digital to analog converter and the overlap converter is greater than one of the plurality of currents generated by the first sub digital to analog converter.

2. The digital to analog converter of claim 1, wherein the currents of the first sub-digital to analog converter comprise the most significant bits and the currents of the second sub-digital to analog converter comprise the least significant bits.

3. The digital to analog converter of claim 2, wherein the currents from the first sub-digital to analog converter comprise a plurality of currents each equal to the master current and the currents from the second sub-digital to analog converter comprise a second plurality of currents cumulatively equal to a single current generated by the first sub digital to analog converter.

4. The digital to analog converter of claim 2, wherein the most significant bits comprise five most significant bits and the least significant bits comprise seven least significant bits.

5. The digital to analog converter of claim 4, wherein the currents of the least significant bits are variably weighted.

6. The digital to analog converter of claim 5, wherein the currents of the least significant bits are binary weighted currents.

7. The digital to analog converter of claim 2, wherein during the first mode, the current of one most significant bit is greater than or equal to the current of all of the least significant bits.

8. The digital to analog converter of claim 1, wherein the sine wave first bit level accuracy is a ten bit level accuracy and the ramp wave second bit level accuracy is a twelve bit level accuracy.

9. A frequency modulated continuous wave transceiver with a multiple mode digital to analog converter, the transceiver comprising:
an analog to digital converter;
a digital to analog converter coupled to the analog to digital converter, the digital to analog converter further comprising:
a current source for providing a master current;
a first sub digital to analog converter coupled to the current source, wherein the first sub digital to analog converter generates a plurality of currents;
a second sub digital to analog converter coupled to at least one of the plurality of currents from the first sub digital to analog converter, wherein the second sub digital to analog converter generates a second plurality of currents;
an overlap adjustment circuit coupled with the second sub digital to analog converter, wherein the overlap adjustment circuit adds current;
a voltage controlled oscillator coupled to the digital to analog converter, wherein;
the digital to analog converter is configured to operate in a first mode for generating a sine wave wherein the sine wave has a first bit level accuracy and wherein the overlap adjustment circuit adds no current to the second sub digital to analog converter,
the digital to analog converter is configured to operate in a second mode for generating a ramp wave to the voltage controlled oscillator, wherein the ramp wave has a second bit level accuracy and wherein the overlap adjustment circuit adds current to the second sub digital to analog converter, and
during the second mode, the total current of the second sub digital to analog converter and the overlap converter is greater than the single current generated by the first sub digital to analog converter.

10. The transceiver of claim 9, wherein the digital to analog converter generates a falling ramp signal.

11. The transceiver of claim 10, wherein the falling ramp signal has a 12 bit level accuracy.

12. The transceiver of claim 9, wherein the digital to analog converter generates a sine wave for transmission to the analog to digital converter.

13. The transceiver of claim 12, wherein the analog to digital converter comprises continuous time sigma delta analog to digital converters.

14. The transceiver of claim 13, wherein the continuous time sigma delta analog to digital converters receive the generated sine wave as an element of an internal check.

15. The transceiver of claim 12, wherein the generated sine wave first bit level accuracy is a ten bit level accuracy.

* * * * *